US010312893B2

(12) United States Patent
Ma

(10) Patent No.: US 10,312,893 B2
(45) Date of Patent: *Jun. 4, 2019

(54) APPARATUSES AND METHODS FOR ADJUSTING TIMING OF SIGNALS

(71) Applicant: MICRON TECHNOLOGY, INC., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 58 days.

This patent is subject to a terminal disclaimer.

(21) Appl. No.: 15/604,297

(22) Filed: May 24, 2017

(65) Prior Publication Data

US 2017/0264277 A1 Sep. 14, 2017

Related U.S. Application Data

(63) Continuation of application No. 14/806,551, filed on Jul. 22, 2015, now Pat. No. 9,698,766.

(60) Provisional application No. 62/087,123, filed on Dec. 3, 2014.

(51) Int. Cl.
*H03K 5/12* (2006.01)
*H03K 5/05* (2006.01)
*H03K 5/156* (2006.01)
*H03K 5/134* (2014.01)

(52) U.S. Cl.
CPC ............. *H03K 5/12* (2013.01); *H03K 5/05* (2013.01); *H03K 5/1565* (2013.01); *H03K 5/134* (2014.07)

(58) Field of Classification Search
CPC ...................................................... H03K 5/12
See application file for complete search history.

(56) References Cited

U.S. PATENT DOCUMENTS

| 5,434,525 | A  | 7/1995  | Leonowich     |
|-----------|----|---------|---------------|
| 6,337,590 | B1 | 1/2002  | Millar        |
| 6,559,727 | B2 | 5/2003  | Boerstler     |
| 6,940,328 | B2 | 9/2005  | Lin           |
| 7,111,185 | B2 | 9/2006  | Gomm et al.   |
| 7,411,464 | B1 | 8/2008  | Hoang et al.  |
| 7,411,852 | B2 | 8/2008  | Nishioka et al.|
| 7,443,216 | B2 | 10/2008 | Gomm et al.   |
| 7,715,260 | B1 | 5/2010  | Kuo et al.    |

(Continued)

FOREIGN PATENT DOCUMENTS

CN 101752009 A 6/2010

*Primary Examiner* — Hai L Nguyen
(74) *Attorney, Agent, or Firm* — Dorsey & Whitney LLP

(57) ABSTRACT

Apparatuses and methods for adjusting timing of signals are described herein. An example apparatus may include a first signal adjustment cell configured to receive a first clock signal and to adjust skew of rising or falling edges of the first clock signal based on a first control signal. The timing adjustment circuit may further include a second signal adjustment cell configured to adjust skew of rising or falling edges of a second clock signal based on a second control signal. The timing adjustment circuit may further include a differential adjustment cell configured to receive the first and second clock signals and to adjust skew of rising or falling edges of the first clock signal based on the first control signal and to adjust skew of rising or falling edges of the second clock signal based on the second control signal. The first and second clock signals may be complementary.

19 Claims, 10 Drawing Sheets

(56) References Cited

U.S. PATENT DOCUMENTS

| | | |
|---|---|---|
| 7,724,036 B2 | 5/2010 | Das |
| 7,786,784 B2 | 8/2010 | Asano |
| 7,835,673 B2 | 11/2010 | Hosokawa et al. |
| 7,945,800 B2 | 5/2011 | Gomm et al. |
| 8,717,835 B2 | 5/2014 | Ma et al. |
| 9,071,235 B2 | 6/2015 | Ma |
| 9,225,319 B2 * | 12/2015 | Ma .................. H03K 19/00361 |
| 9,331,702 B2 | 5/2016 | Ma et al. |
| 9,698,766 B2 * | 7/2017 | Ma .......................... H03K 5/12 |
| 2002/0060592 A1 | 5/2002 | Shimoda et al. |
| 2004/0041609 A1 | 3/2004 | Lin |
| 2005/0182983 A1 | 8/2005 | Gaskins et al. |
| 2009/0160520 A1 | 6/2009 | Matsunami |
| 2010/0090730 A1 | 4/2010 | Wu |
| 2011/0204963 A1 | 8/2011 | Kim |
| 2012/0182057 A1 | 7/2012 | Ma et al. |
| 2013/0051166 A1 * | 2/2013 | Ma ........................ G11C 7/222 |
| | | 365/194 |
| 2013/0169330 A1 | 7/2013 | Ma |
| 2014/0240013 A1 | 8/2014 | Ma et al. |
| 2015/0109042 A1 | 4/2015 | Ma |
| 2015/0162919 A1 | 6/2015 | Ma et al. |
| 2016/0164508 A1 | 6/2016 | Ma |
| 2016/0164509 A1 | 6/2016 | Ma |

* cited by examiner

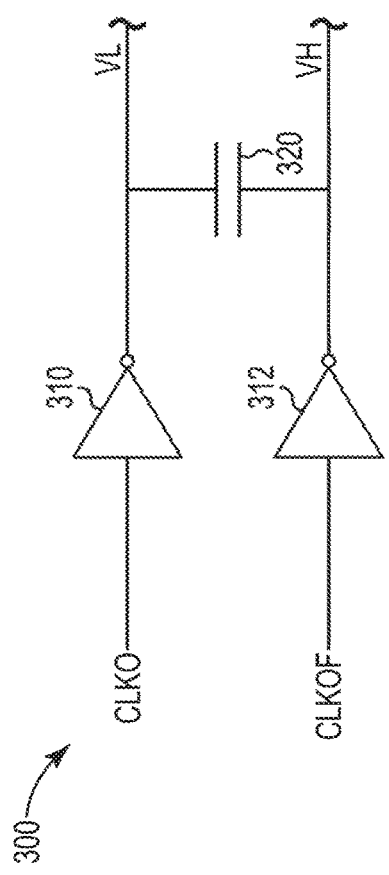
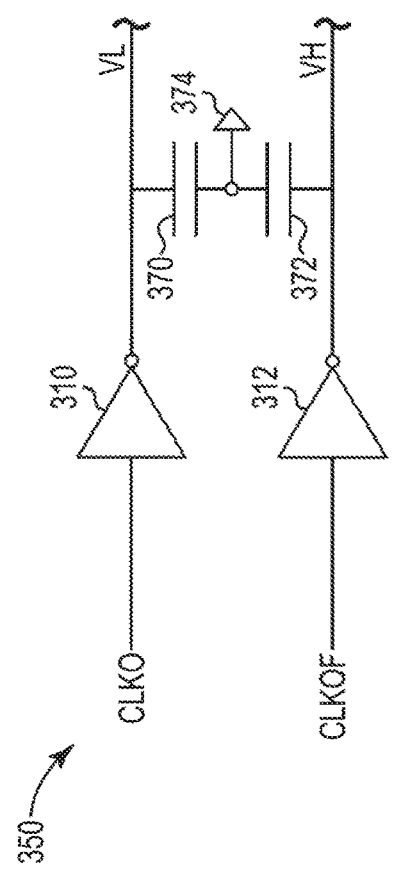

APPARATUSES AND METHODS FOR ADJUSTING TIMING OF SIGNALS

CROSS-REFERENCE TO RELATED APPLICATIONS

This application is a continuation of U.S. application Ser. No. 14/806,551, filed Jul. 22, 2015 and issued as U.S. Pat. No. 9,698,766 on Jul. 4, 2017, which claims the filing benefit of U.S. Provisional Application No. 62/087,123, filed Dec. 3, 2014, The applications and patent(s) are incorporated by reference herein in their entirety and for all purposes.

BACKGROUND

As memory clock speeds continue to rise, clock signal reliability and accuracy have become increasingly important, particularly with respect to signal characteristics such as duty cycle. Conventional approaches for controlling signal duty cycle, however, typically are associated with relatively high power demands and often suffer from limited accuracy across operational frequency ranges. Higher frequencies, for example, are especially problematic in duty cycle correction. Briefly, conventional duty cycle correction circuits having these high power demands and poor high frequency performance are not practical as devices, such as mobile devices, rely on progressively lower power consumption and higher operating frequencies.

BRIEF DESCRIPTION OF THE DRAWINGS

FIG. 3A is a schematic diagram of a duty cycle detection circuit according to an embodiment of the present invention.

FIG. 3B is a schematic diagram of a duty cycle detection circuit according to an embodiment of the present invention.

DETAILED DESCRIPTION

Apparatuses and methods for timing adjustment circuits are described herein. Certain details are set forth below to provide a sufficient understanding of embodiments of the invention. However, it will be clear to one having skill in the an that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
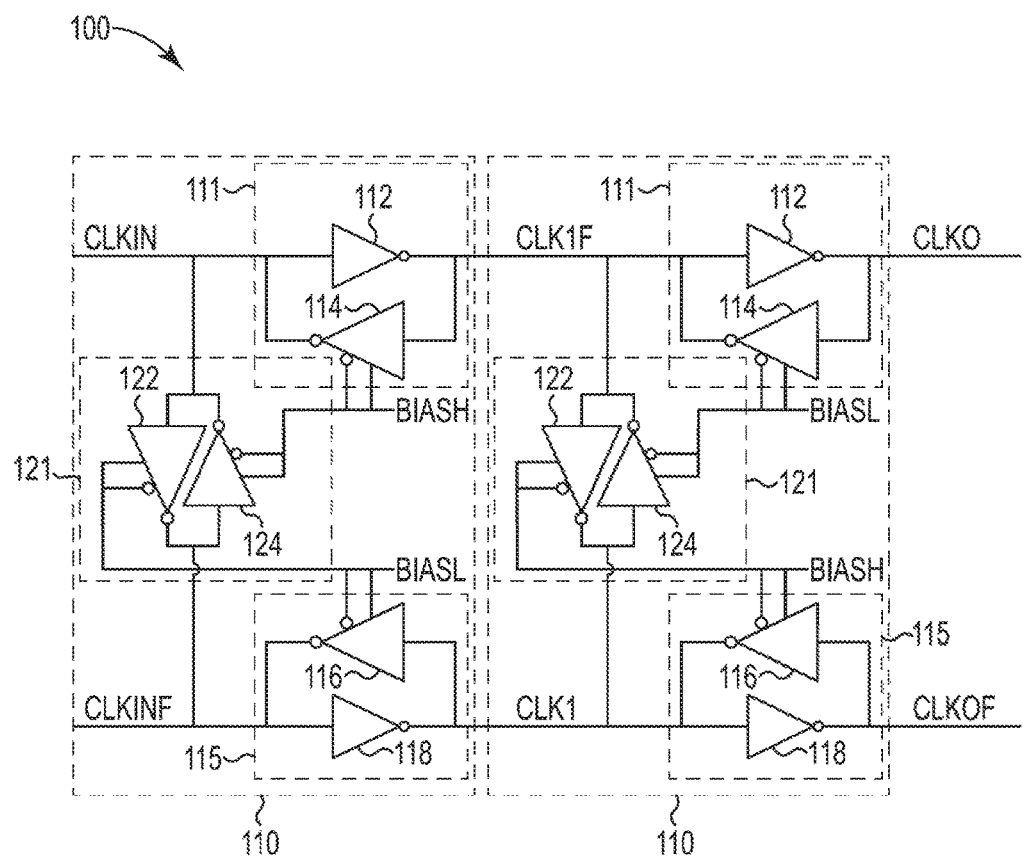
FIG. 1 is a schematic diagram of an apparatus including a timing adjustment circuit according to an embodiment of the present invention.

FIG. 1 is a block diagram of an apparatus that includes a timing adjustment circuit 100 according to an embodiment of the present invention. The apparatus may comprise circuitry, one or more semiconductor die, a packaged semiconductor, a device including such circuitry, die, or package, and/or a system including such a device. The timing adjustment circuit 100 includes a plurality of timing adjustment elements 110. Each of the timing adjustment elements 110 may include signal adjustment cells 111, 115 and a differential adjustment cell 121. The signal adjustment cell 111 may include inverters 112, 114, and the signal adjustment cell 115 may include inverters 116, 118. The differential adjustment cell 121 may include inverters 122, 124.

In some examples, each timing adjustment element 110 of the timing adjustment circuit 100 may operate in substantially a same manner. Accordingly, description is made herein to the components and operation of a single timing adjustment element 110. It will be appreciated that the timing adjustment circuit 100 may include one or more timing adjustment elements 110, such as two timing adjustment elements 110 as illustrated in FIG. 1, or alternatively one or four timing adjustment elements 110. Including multiple timing adjustment elements 110 may, for instance, increase the degree to which the timing adjustment circuit 110 may adjust signals in accordance with examples described herein. In some examples, each timing adjustment element 110 may operate based on a same set of control signals (e.g., bias signals BIASH, BIASL). In other examples, each timing adjustment element 110 may operate based on a respective set of control signals.

The inverters 112, 114 of the signal adjustment cell 111 may be arranged in a cross-coupled configuration. In one embodiment, for example, the inverter 112 may have a driver strength that is substantially constant. In an alternate embodiment the inverter 112 may have a driver strength that is variable complementary to that of the inverter 114. The inverter 112 may be configured to receive a clock signal CLKIN and provide a clock signal CLKIF based on the clock signal CLKIN, and the inverter 114 may be configured to receive a bias signal BIASH and operate based on the bias signal BIASH. By way of example, the inverter 114 may be a bias-controlled inverter and accordingly may operate with a drive strength that is based on a magnitude of the bias signal BIASH. In some examples, the inverter 112 may include transistors having different transistor dimensions than transistors included in the inverter 114. The inverter 112, for instance, may include transistors having greater widths than transistors of the inverter 114.

Similarly, the inverters 116, 118 of the signal adjustment cell 115 may be arranged in a cross-coupled configuration. In one embodiment, for example, the inverter 118 may have a driver strength that is substantially constant. In an alternate embodiment, the inverter 118 may have a driver strength that is variable complementary to that of the inverter 116. The inverter 118 may be configured to receive a clock signal CLKINF and provide a clock signal CLK1 based on the clock signal CLKINF, and the inverter 116 may be configured to receive a bias signal BIASL and operate based on the bias signal BIASL. By way of example, the inverter 116 may be a bias-controlled inverter and accordingly may operate with a drive strength that is based on a magnitude of the bias signal BIASL. In some examples, the inverter 118 may include transistors having different transistor dimensions than transistors included in the inverter 116. The inverter 118, for instance, may include transistors having greater widths than transistors of the inverter 116. In some examples, the clock signal CLKINF may be a complement of the clock signal CLKIN, and/or the bias signal BIASL may be the complement of the bias signal BIASH.

The inverters 122, 124 of the differential adjustment cell 121 may be arranged in a cross-coupled configuration. The inverter 122 may be configured to receive the clock signal CLKIN and the bias signal BIASL, and the inverter 124 may be configured to receive the clock signal CLKINF and the bias signal BIASH, respectively. The inverter 122 may be configured to operate based on the bias signal BIASL, and the inverter 124 may be configured to operate based on the bias signal BIASH. In some embodiments, each of the inverters 122, 124 may be bias controlled inverters. Accordingly, the inverter 122 may operate with a drive strength that is based on a magnitude of the bias signal BIASL, and the inverter 124 may operate with a drive strength that is based on a magnitude of the bias signal BIASH. In some examples, the inverters 122, 124 may have transistors having a same width, and in other examples, transistors included in the inverters 122, 124 may have different widths. In various embodiments, the bias signals may be analog or digital signals.

The signal adjustment cell 111 may be configured to adjust the clock signal CLKIN based on the bias signal BIASH to provide the clock signal CLKIF. Adjusting the clock signal CLKIN may, for instance, include adjusting the skew of rising edges and/or falling edges of the clock signal CLKIN. In one embodiment, for example, the drive strength of the inverter 114 may be less than that of the drive strength of the inverter 112 (recall that the drive strength of the inverter 114 may be based on the bias control signal and the inverter may include transistors having different widths than that of the inverter 112). As a result, the output of the inverter 114 may adjust the time at which rising edges and/or falling edges of the clock signal CLKIN occur. In some examples, the inverter 114 may adjust the time at which edges occur by adjusting a rate at which the clock signal CLKIN transitions (e.g., from a logic low to a logic high) such that transitions of the output of the inverter 112 are altered (e.g., delayed). As previously described, the drive strength of the inverter 114 may be less than the drive strength of the inverter 112, and as a result, the signal adjustment cell 111 may not operate as a latch to latch the clock signal CLKIN during operation.

In some examples, the inverter 114 may adjust the skew of rising edges and falling edges of the clock signal CLKIN by different amounts, and the manner in which the inverter 114 adjusts each type of edge may be based on the bias signal BIASH. For example, if the bias signal BIASH has a relatively low voltage level (e.g., 25% of VCC), the inverter 114 may adjust skew of falling edges of the clock signal CLKIN by a greater amount than an amount by which the inverter 114 may adjust skew of rising edges of the clock signal CLKIN. In some examples, an amount of adjustment of skew of the rising edges may be negligible. Conversely, if the bias signal BIASH has a relatively high voltage level (e.g., 75% of VCC), the inverter 114 may adjust rising edges of the clock signal CLKIN by a greater amount than that by which an amount by which the inverter 114 may adjust skew of falling edges of the clock signal CLKIN. In some examples, an amount of adjustment of skew of the falling edges may be negligible. Generally for the example, the lower the voltage of the bias signal BIASH below a threshold voltage (e.g., VCC/2), the more the skew of rising edges of CLKIF may be adjusted, and the greater the voltage of the bias signal BIASH beyond the threshold voltage, the more skew of falling edges of CLKIF may be adjusted.

Figure 1A:
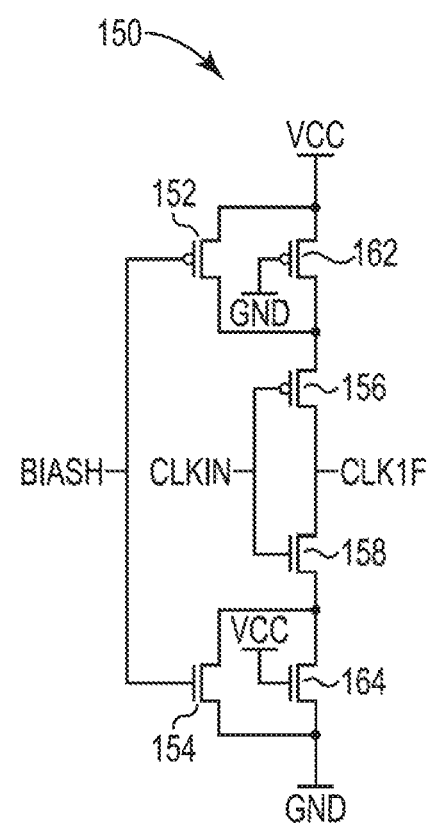
FIG. 1A is a schematic diagram of an inverter according to an embodiment of the present invention.

With reference to FIG. 1A, an inverter 150 is shown that may be used to implement the inverter 114 and/or any other bias-controlled inverters of the timing adjustment circuit 100 (e.g., inverters 116, 122, 124). The inverter 150 may include transistors 162, 156, 158, and 164, which may be configured to operate as an inverter (e.g., CMOS inverter). The transistor 162 may be coupled to a reference voltage GND and the transistor 164 may be coupled to a supply voltage VCC, and accordingly the transistors 162, 164 may determine the basic drive strength of the inverter 150. The inverter 150 may further include a transistor 152, which may be coupled in parallel with the transistor 162, and a transistor 154, which may be coupled in parallel with transistor 164. The transistors 152 and 154 may be configured to receive a bias signal, such as the bias signal BIASH. In some examples, the ratio of dimensions (e.g., channel widths) of the transistors 152, 154 may be configured such that, based on the bias signal, the drive strength of the inverter 150 is adjusted. The magnitude of the bias signal may, for instance, dictate the degree to which drive strength is adjusted. Adjusting the drive strength in this manner may, for instance, adjust the rate at which the inverter may transition signal levels of the output clock signal CLKIF.

Referring back to FIG. 1, in some examples, the signal adjustment cell 115 may operate in a complementary manner relative to the signal adjustment cell 111. For instance, the signal adjustment cell 115 may be configured to adjust the clock signal CLKINF based on the bias signal BIASL to provide the clock signal CLK1. Adjusting the clock signal CLKINF may include adjusting the skew of rising edges and/or falling edges of the clock signal CLKINF. As described with respect to the inverter 114, the inverter 116 may have a different drive strength than the inverter 118 and accordingly may adjust the time at which rising edges and/or falling edges of the clock signal CLKINF occur based on the bias signal BIASL. In some examples, the inverter 114 may adjust the skew of rising edges and falling edges of the clock signal CLKIN by different amounts. For example, if the bias signal BIASL has a relatively low voltage level (e.g., 25% of VCC), the inverter 116 may adjust skew of falling edges of the clock signal CLKINF by a greater amount than an amount by which the inverter 116 may adjust skew of rising edges of the clock signal CLKIN. In some examples, an amount of adjustment of skew of the rising edges may be negligible. Conversely, if the bias signal BIASL has a relatively high voltage level (e.g. 75% of VCC), the inverter 116 may adjust rising edges of the clock signal CLKINF by a greater amount than that by which an amount by which the inverter 116 may adjust skew of falling edges of the clock signal CLKIN. In some examples, an amount of adjustment of skew of the falling edges may be negligible. Generally for the example, the lower the voltage of the bias signal BIASL below a threshold voltage (e.g., VCC/2), the more the skew of rising edges of CLK1 may be adjusted, and the greater the voltage of the bias signal BIASH beyond the threshold voltage, the more skew of falling edges of CLK1 may be adjusted.

As previously described, the bias signals BIASH, BIASL may be complementary. As a result, during operation each of the signal adjustment cell 111 and the signal adjustment cell 115 may adjust the skew of opposite types of edges. For example, the signal adjustment cell 111 may adjust the skew of rising edges and the signal adjustment cell 115 may adjust the skew of falling edges. Moreover, because the clock signals CLKIN and CLKINF may be complementary, each of the signal adjustment cell 111 and the signal adjustment cell 115 may adjust the skew of respective edges simultaneously. In this manner, the timing adjustment element 110 may maintain the complementary nature of the clock signals CLKIN, CLKINF when providing the clock signals CLK1, CLKIF.

The differential adjustment cell 121 may be configured to adjust the clock signals CLKIN, CLKINF based on the bias signals BIASH, BIASL, respectively. For example, the differential adjustment cell 121 may adjust the skew of rising edges and/or falling edges of each of the clock signals CLKIN, CLKINF. Where the drive strength of each inverter 122, 124 may be the same, each of the inverters 122, 124 may adjust skew of a respective clock signal CLKIN, CLKINF a same amount. Moreover, where each of the clock signals CLKIN, CLKINF and each of the bias signals BIASH, BIASL may be complementary, inverters 122, 124 may adjust skew for opposite types of edges and at a same time, as described.

In some examples, the degree to which the inverters 122, 124 may adjust skew may be based on the drive strength of the inverters 122, 124. In one example, the inverters 122, 124 may each have a relatively low drive strength such that the differential adjustment cell 121 may provide relatively small adjustments to skew compared to adjustments provided by signal adjustment cells 111, 115. In another example, the inverters 122, 124 may have relatively high drive strength such that the timing adjustment element 110 may allow the timing adjustment element 110 to adjust skew over a greater range compared to other examples. In yet another example, a timing adjustment element 110 may include multiple differential adjustment cells 121 (not shown in FIG. 1), each of which may include inverters having any desired drive strength such that skew may be adjusted by any desired amount.

The CLK1 and CLKIF signals are provided by the first timing adjustment element 110 as input signals to the second timing adjustment element 110. The signal adjustment cell 111 of the second timing adjustment element 110 may be configured to adjust the clock signal CLKIF based on the bias signal BIASL to provide the clock signal CLKO. The signal adjustment cell 115 of the second timing adjustment element 110 may be configured to adjust the clock signal CLK1 based on the bias signal BIASH to provide the clock signal CLKOF. The differential adjustment cell 121 of the second timing adjustment element 110 may be configured to adjust the clock signals CLKIF, CLK1 based on the bias signals BIASH, BIASL, respectively. Switching the bias signals BIASH and BIASL provided to the signal adjustment cells 111 and 115, and to the inverters 122 and 124 of the differential adjustment cell 121 of the second timing adjustment element 110 in comparison to the first timing adjustment element 110 may allow for rising and falling edges of the clock signals to be balanced as the clock signals are adjusted by the first and second timing adjustment elements 110. While FIG. 1 illustrates the use of two timing adjustment elements 110, one or more timing adjustment elements 110 may be used in different embodiments.

Figure 2:
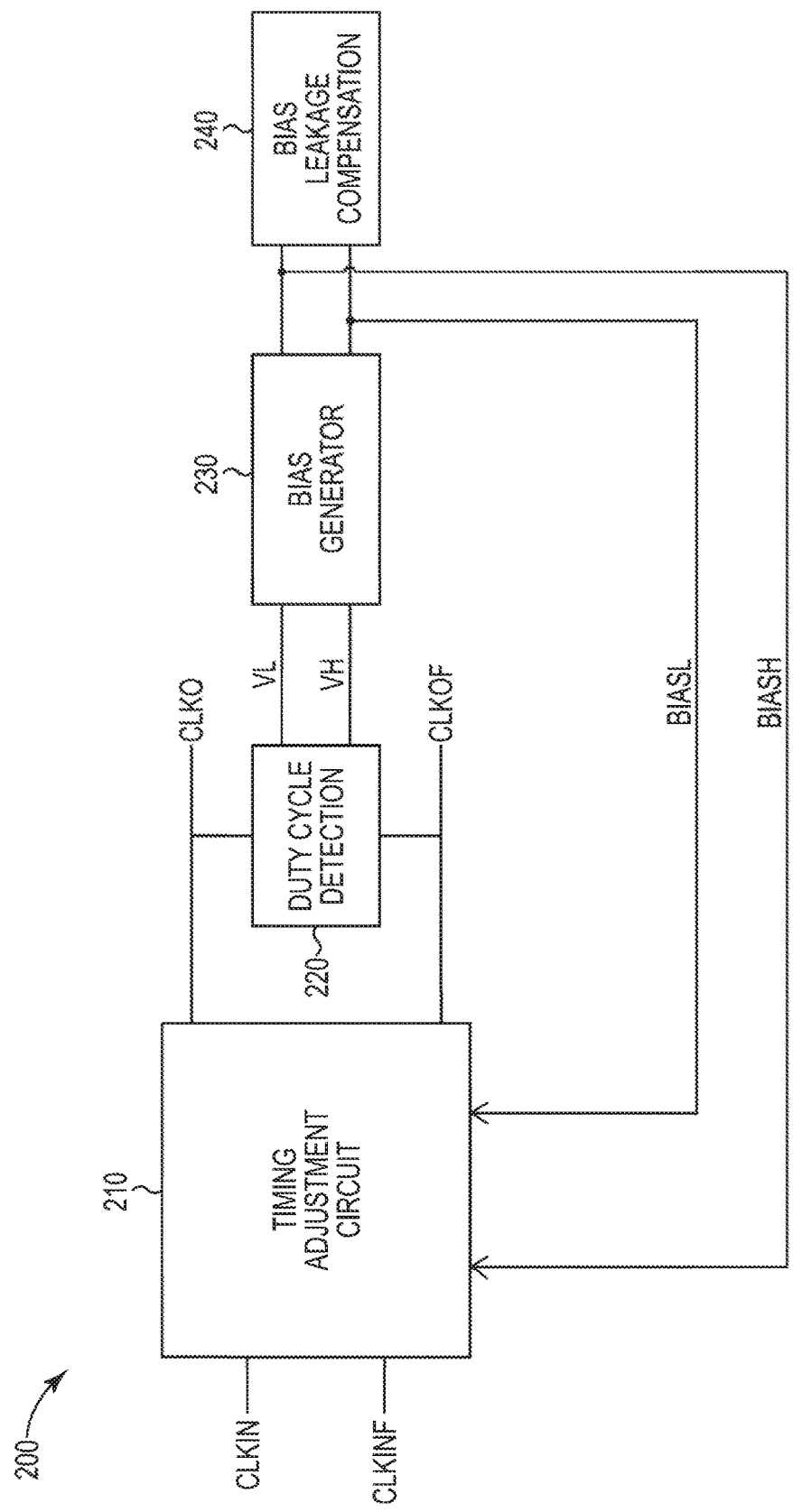
FIG. 2 is a block diagram of an apparatus including a duty cycle correction (DCC) circuit according to an embodiment of the present invention.

FIG. 2 is a block diagram of an apparatus including a DCC circuit 200 according to an embodiment of the present invention. The DCC circuit 200 includes a timing adjustment circuit 210, a duty cycle detection circuit 220, a bias generator 230, and a bias leakage compensation circuit 240. In some examples, the timing adjustment circuit 210 may be implemented using the timing adjustment circuit 100 of FIG. 1.

The timing adjustment circuit 210 may be coupled to the bias generator 230 and configured to receive the bias signals BIASH, BIASL. The timing adjustment circuit 210 may further receive the input clock signals CLKIN, CLKINF and provide the output clock signals CLKO, CLKOF based on the bias signals BIASH, BIASL. As described, the timing adjustment circuit 210 may be configured to adjust the input clock signals CLKIN, CLKINF based on the bias signals BIASH, BIASL. Adjusting the input clock signals CLKIN, CLKINF may include adjusting skew of the input clock signals CLKIN, CLKINF.

The duty cycle detection circuit 220 may be coupled to the timing adjustment circuit 210 and configured to receive the output clock signals CLKO, CLKOF. The duty cycle detection circuit 220 may be configured to determine a duty cycle of the clock signals CLKO, CLKOF and provide control signals VL, VH indicating the same. For example, the duty cycle detection circuit 220 may determine which of the clock signals CLKO, CLKOF has a greater duty cycle or whether the clock signals CLKO, CLKOF have a same duty cycle. The duty cycle detection circuit 230 may be implemented using any duty cycle detection circuit known in the art, now or in the future.

The bias generator 230 may be coupled to the duty cycle detection circuit and configured to receive the control signals VL, VH. Based on the control signals VL, VH, the bias generator 230 may provide the bias signals BIASH, BIASL. In some examples, when the bias generator 230 receives control signals VL, VH indicating which of the clock signals CLKO, CLKOF has a greater duty cycle, the bias generator 230 may adjust respective voltage levels of the bias signals BIASH, BIASL to cause the timing adjustment circuit 210 to provide the output clock signals CLKO, CLKOF with particular duty cycles. In this manner, the bias signals BIASH, BIASL may be used as control signals to controller operation of the timing adjustment circuit 210.

In some examples, the bias signals BIASH, BIASL may be analog bias signals and/or may be complementary. Accordingly, adjusting the bias signal BIASH in a first manner (e.g., increasing the voltage level of the bias signal BIASH) may Include adjusting the bias signal BIASL in a second manner (e.g., decreasing the voltage level of the bias signal BIASL). The bias generator 230 may continue to adjust voltage levels of the bias signals BIASH, BIASL, for instance, until the duty cycles of the output clock signals CLKO, CLKOF satisfy a duty cycle threshold. In some examples, the bias generator 230 may aim to achieve a 50% duty cycle for each of the output clock signals CLKO, CLKOF. When the duty cycle threshold is satisfied, the voltage levels of the BIASH, BIASL bias signals may be maintained to maintain the desired duty cycle for the output clock signals CLKO, CLKOF. In some embodiments, the bias leakage compensation circuit 240 may be coupled to the bias generator 230 and configured to compensate for leakage of the bias signals BIASH, BIASL during periods when the DCC circuit 200 is operating and/or during periods when the DCC circuit 200 is in a power down mode. Compensating for leakage may assist in maintaining the voltage levels of the bias signals BIASH, BIASL. As will be explained in more detail below, the bias leakage compensation circuit 240 may use passive (e.g., static) leakage compensation and/or active leakage compensation to compensate for leakage of the bias signals BIASH, BIASL.

In an example operation of the DCC circuit 200, the timing adjustment circuit 210 may receive the clock signals CLKIN, CLKINF and the bias signals BIASL, BIASH, and in response, adjust skew of one or more of the clock signals CLKIN, CLKINF based on the bias signals BIASL, BIASH. As described, in some embodiments, the timing adjustment circuit 210 may adjust skew based on voltage levels of the bias signals BIASL, BIASH. The adjusted clock signals CLKIN, CLKINF may be provided as output clock signals CLKO, CLKOF.

The duty cycle detection circuit 220 may receive the output clock signals CLKO, CLKOF and determine a duty cycle of the clock signals CLKO, CLKOF and provide control signals VL, VH indicating the same. For example, the duty cycle detection circuit 220 may determine which of the output clock signals CLKO, CLKOF has a greater duty cycle, or whether the output clock signals CLKO, CLKOF have approximately a same duty cycle. As will be described, the voltage level of the control signal VL relative to the voltage level of the control signal VH may indicate which of the output clock signals CLKO, CLKOF has a greater duty cycle, or whether the output clock signals CLKO, CLKOF have a same duty cycle.

The bias generator 230 may receive the control signals VL, VH and based on the control signals VL, VH, provide the bias signals BIASL, BIASH having voltage levels to cause the timing adjustment circuit 210 to adjust one the duty cycle of one or more of the input clock signals CLKIN, CLKINF. The bias leakage compensation circuit 240 may receive the bias signals BIASL, BIASH and compensate for leakage of the bias signals BIASH, BIASL, and further may employ passive leakage compensation and/or active leakage compensation.

FIG. 3A is a schematic diagram of a duty cycle detection circuit 300 according to an embodiment of the present invention. The duty cycle detection circuit 300 may be used to implement the duty cycle detection circuit 220 of FIG. 2. The duty cycle detection circuit 300 includes inverters 310, 312 and a capacitor 320.

The inverter 310 may be configured to receive the clock signal CLKO from a timing adjustment circuit, such as the timing adjustment circuit 200 of FIG. 2, and provide a control signal VL based on the clock signal CLKO. The inverter 312 may be configured to receive the complement of the clock signal CLKO, the output clock signal CLKOF, from a timing adjustment circuit and provide a control signal VH based on the output clock signal CLKOF.

While the control signals VL, VH may be based on clock signals CLKO and CLKOF, respectively, one or more of the control signals VL, VH may further be based on the charging and discharging of the capacitor 320. By way of example, the control signals VL, VH may differentially charge and discharge the capacitor 320. During operation, for instance, each of the control signals VL, VH may charge and discharge a respective plate of the capacitor 320 as voltage levels of the control signals VL, VH vary. Charge provided by the capacitor 320 may cause one of the control signals VL, VH to have a greater magnitude than the other. Because the clock signals CLKO, CLKOF may be complementary, the control signal VL, VH having the greater magnitude may indicate which clock signal CLKO, CLKOF has a greater duty cycle. The control signals VL, VH may, for instance, indicate which of the clock signals CLKO, CLKOF has a greater duty cycle in accordance with the following equations:

$V_L > V_H$, if CLKO<50% duty cycle and CLKOF>50% duty cycle, $V_L = V_H$, if CLKO=50% duty cycle, and CLKOF=50% duty cycle, and $V_L < V_H$, if CLKO>50% duty cycle, and CLKOF<50% duty cycle.

FIG. 3B is a schematic diagram of a duty cycle detection circuit 350 according to an embodiment of the present invention. The duty cycle detection circuit 350 may be used to implement the duty cycle detection circuit 220 of FIG. 2. The duty cycle detection circuit 350 includes elements that have been previously described with respect to the duty cycle detection circuit 300 of FIG. 3A. Those elements have been identified in FIG. 3B using the same reference numbers used in FIG. 3A and operation of the common elements is as previously described. Consequently, a detailed description of the operation of these elements will not be repeated in the interest of brevity.

The duty cycle detection circuit 350 may include capacitors 370, 372 that may be coupled in series between the outputs of inverters 310, 312. In some examples, each of the capacitors 370, 372 may further be coupled to a reference voltage 374, such as ground. In some examples, the capacitors 370, 372 may include a common bottom plates which is coupled to the reference voltage 374.

The control signals VL, VH may be based on clock signals CLKO and CLKOF, respectively, and may further be based on the charging and discharging of the capacitors 370, 372. During operation, the control signals VL may charge (and discharge) a plate of the capacitor 370 and the control signal VH may charge (and discharge) a plate of the capacitor 372. In this manner, charge provided by the capacitors 370, 372 may cause one of the control signals VL, VH to have a greater magnitude than the other. Because the clock signals CLKO, CLKOF may be complementary, the control signal VL, VH having the greater magnitude may indicate which clock signal CLKO, CLKOF has a greater duty cycle. By including the capacitors 370, 372 coupled between the outputs of the inverters 310, 312 and to the reference voltage 374, the duty cycle detection circuit 350 may compensate for non-ideal, asymmetrical charging that may otherwise result from use of a single capacitor.

Figure 4:
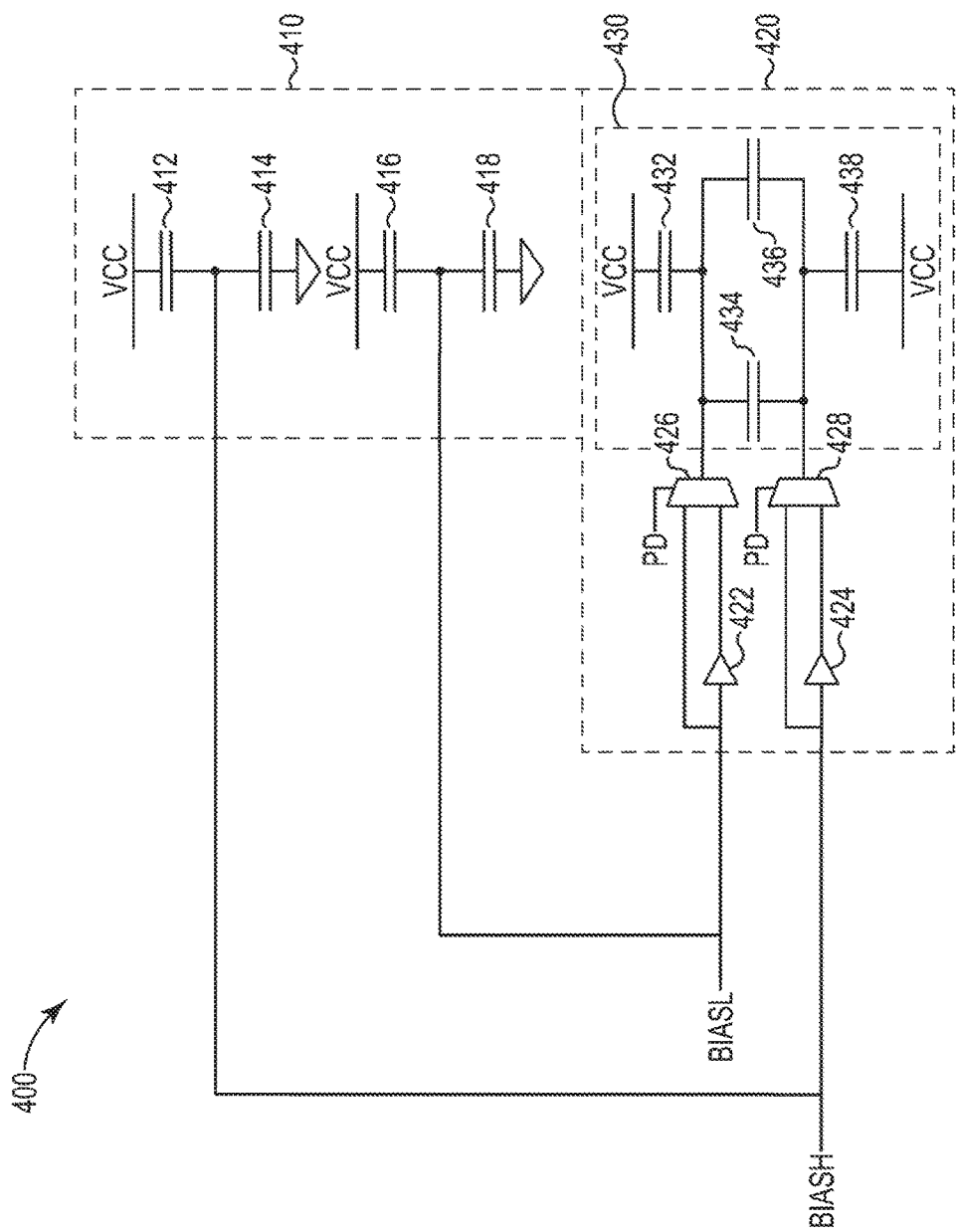
FIG. 4 is a schematic diagram of a bias leakage compensation circuit according to an embodiment of the present invention.

FIG. 4 is a schematic diagram of a bias leakage compensation circuit 400 according to an embodiment of the present invention. The bias leakage compensation circuit 400 may be used to implement the bias leakage compensation circuit 240 of FIG. 2. The bias leakage compensation circuit may include a passive leakage compensation circuit 410 and an active leakage compensation circuit 420.

The passive leakage compensation circuit 410 may include capacitors 412, 414, 416, and 418. The capacitor 412 may be coupled to a supply voltage, such as VCC, and to the capacitor 414. The capacitor 414 may further be coupled to a reference voltage, such as ground. The capacitors 412, 414 may receive the bias signal BIASH at a node to which the capacitors 412, 414 are both coupled. Similarly, the capacitor 416 may be coupled to a supply voltage, such as VCC, and to the capacitor 418. The capacitor 418 may further be coupled to a reference voltage, such as ground. The capacitors 416, 418 may further receive the bias signal BIASL at a node to which the capacitors 416, 418 are both coupled.

In some examples, each of the capacitors 412-418 may have a same magnitude of capacitance. In this manner, the pair of capacitors 412, 414 and the pair of capacitors 416, 418 may provide identical capacitive paths between the supply voltage VCC and the node, and the node and the reference voltage ground, respectively. By providing identical capacitive paths, the capacitors 412-418 of the passive leakage compensation circuit 410 may serve as a filter to control leakage of the BIASH and BIASL bias signals during operation. By way of example, the passive leakage compensation circuit 410 may reduce volatility of voltage levels of the BIASH and BIASL during operation. In some examples, the passive leakage compensation circuit 410 may aim to achieve a uniform leakage between each pair of coupled capacitors 412, 414 and 416, 418 (e.g., same leakage through each of capacitors 412, 414 and same leakage through each of capacitors 416, 418) While the passive leakage compensation circuit 410, as illustrated, may provide first order leakage compensation (e.g., by operating as a first order approximation), it will be appreciated that the passive leakage compensation circuit 410 may operate as any other order approximation and/or provide leakage compensation in any another manner known in the art.

The active leakage compensation circuit 420 may include buffers 422, 424 and multiplexers 426, 428. The active leakage compensation circuit 420 further may include a capacitive network 430 including capacitors 432, 434, 436, and 438. The buffer 422 may be configured to receive the bias signal BIASL and provide a buffered bias signal BIASL to the multiplexer 426. Similarly, the buffer 424 may be configured to receive the bias signal BIASH and provide a buffered bias signal BIASH to the multiplexer 428. The multiplexers 426, 428 may further be configured to receive the BIASL, BIASH bias signals, respectively. In some examples, one or more of the buffers 422, 424 may be unity gain buffers.

The multiplexer 426 may be configured to provide the control signal BIASL or the buffered bias signal BIASL based on a control signal PD, and the multiplexer 428 may be configured to provide the bias signal BIASH or the buffered bias signal BIASH based on the control signal PD. The control signal PD may, for instance, be provided by a controller, such as a memory controller (not shown in FIG. 4), or may be provided by control logic included in a bias generator, such as the bias generator 230 of FIG. 2. The capacitors 434, 436 may be coupled between the outputs of the multiplexers 426, 428. The capacitor 432 may be coupled between a supply voltage, such as VCC, and the output of the multiplexer 426. The capacitor 438 may be coupled between a supply voltage, such as VCC, and an output of the multiplexer 428. In some examples, each of the capacitors 432-438 may include a top plate and a bottom plate. The capacitor 434 may be coupled to the output of the multiplexer 426 at the top plate thereof and to the output of the multiplexer 428 at the bottom plate thereof. Conversely, the capacitor 436 may be coupled to the output of the multiplexer 426 at the bottom plate thereof and to the output of the multiplexer 428 at the top plate thereof. In some examples, each of the capacitors 432-438 may have a same capacitance. In other examples, the capacitors 434, 436 may have a greater capacitance than the capacitors 432, 438.

In some examples, the active leakage compensation circuit 400 may be configured to operate in accordance with a plurality of modes, such as an operating mode and a power down mode. In the operating mode, the control signal PD may not be asserted (e.g., having a logic low). As a result, the multiplexers 426, 428 may provide the buffered bias signal BIASL and the buffered bias signal BIASH, respectively, to the capacitive network 430. Accordingly, the buffers 422, 424 may charge one or more capacitors of the capacitive network 430 during operation. The buffer 422, for instance, may charge the capacitor 434, and the buffer 424 may charge the capacitor 436. In some examples, the buffers 422, 424 may have a relatively slow rate of transition relative to the bias signals BIASH, BIASL. Accordingly, the buffers 422, 424 may compensate for volatility of the bias signals BIASH, BIASL when charging capacitors of the capacitive network 430.

In the power down mode, the control signal PD may be asserted. As a result, the multiplexers 426, 428 may couple the bias signals BIASH, BIASL directly to the capacitive network 430. In turn, the capacitive network 430 may provide negative feedback (e.g., charge) to the bias signals BIASH, BIASL to control (e.g., stabilize) voltage levels of the bias signals BIASH, BIASL during the period when the active leakage compensation circuit 420 operates in the power down mode. In at least one embodiment, the capacitors 434, 436 may control voltage levels by capacitively coupling the bias signals BIASH, BIASL to one another to mitigate signal swing during the power down mode.

Figure 5:
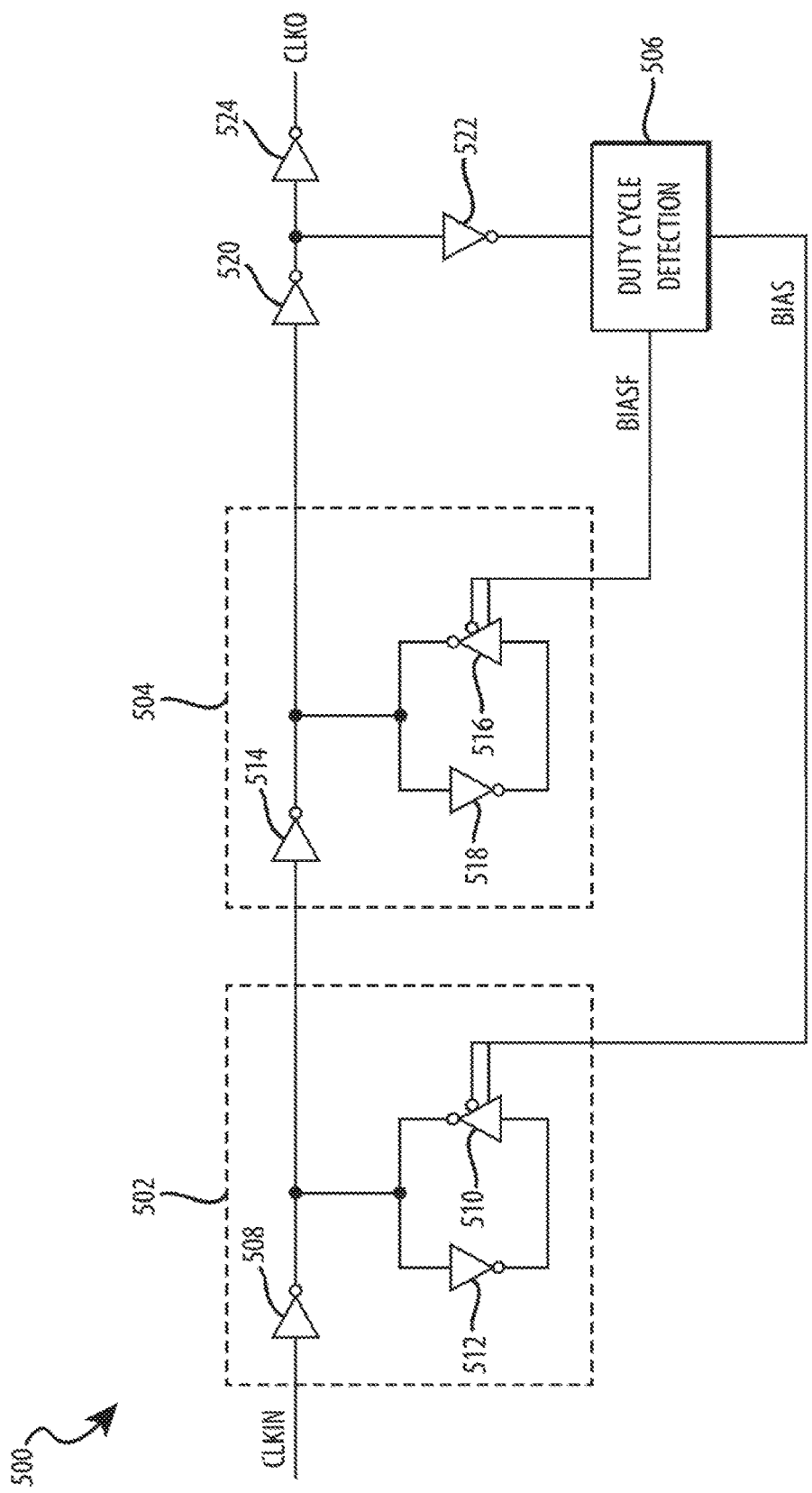
FIG. 5 is a schematic diagram of a duty cycle correction circuit with an analog floating latch adjuster circuit according to an embodiment of the present invention.

FIG. 5 is a schematic diagram of a DCC circuit, generally designated 500, with two analog floating latch adjuster circuits according to an embodiment of the present invention. DCC circuit 500 may include floating latch adjuster circuits 502 and 504, one or more output inverters 520, 524, and 522, and a duty cycle detection circuit 506. In an alternate embodiment, the DCC circuit 500 may includes one of the floating latch adjuster circuits 502 and 504. In an alternate embodiment, the DCC circuit 500 may include two or more latch circuits 502 or 504. The DCC circuit 500 may receive a clock signal CLKIN and provide a clock signal CLKO based on the floating latch adjuster circuits 502 and 504. The floating latch adjuster circuit 502 may be used to adjust the duty cycle of a single ended clock signal CLKIN while minimizing the necessary logic and power consumption.

The floating latch adjuster circuit 502 may include inverters 508, 510, and 512. The inverter 508 may have a drive strength that is substantially constant and receive the clock signal CLKIN as an input. An output node of the inverter 508 may be coupled to an input node of the inverter 512 and an output node of the inverter 510. An output node of the inverter 512 may be coupled to an input node of the inverter 510. The inverters 512 and 510 may constitute a floating latch in which the output of the inverter 512 is floating (e.g., it is not connected to any circuit elements other than the inverter 510). The inverter 510 may also receive a bias voltage BIAS which may increase or decrease the drive strength of the inverter 510, in order to change the slew rate of the clock signal CLKIN at an output of the inverter 508. In some examples, the inverter 510 may include transistors having different transistor dimensions than transistors included in the inverter 508. Accordingly, the inverter 510 may adjust the duty cycle of the clock signal CLKIN at the output of the inverter 508 based on the bias voltage BIAS.

Adjusting the clock signal CLKIN may, for instance, include adjusting the skew of rising edges and/or falling edges of the clock signal CLKIN. In one embodiment, for example, the drive strength of the inverter 510 may be less than that of the drive strength of the inverter 508 (recall that the drive strength of the inverter 510 may be based on the bias voltage BIAS and the inverter 510 may include transistors having different transistor dimensions than that of the inverter 508). As a result, the output of the inverter 510 may adjust the time at which rising edges and/or falling edges of the clock signal CLKIN occur at the output of the inverter 508.

The output of the floating latch adjuster circuit 502 may provide an input to the floating latch adjuster circuit 504. The floating latch adjuster circuit 504 may include inverters

514, 516, and 518. The inverter 514 may have a substantially constant drive strength and receive the output signal of the floating latch adjuster circuit 502 at an input node. The output node of the inverter 514 may be coupled to the input node of the inverter and the output node of the inverter 516. The output node of the inverter 518 may be coupled to the input node of the inverter 516. The inverter 516 may also receive bias information as a bias voltage BIASF which may increase or decrease the drive strength of the inverter 516. In various embodiments, the bias voltage BIASF is the complement of the bias voltage BIAS. The floating latch adjuster circuit 504 may provide its output to one or more of the output inverters 520, 524, and/or 522, which may provide the clock signal CLKO (e.g., through output inverters 520 and 524 in FIG. 5). The output inverters 520 and 522 may also provide an input to the duty cycle detection circuit 506.

The duty cycle detection circuit 506 may receive the output signal of one or more output inverters (e.g., output invert 522), determine whether the duty cycle of the received signal requires adjustment based on an acceptable duty cycle range, and provide bias information in the form of bias voltages BIAS and BIASF to the inverters 510 and 516, respectively. The acceptable duty cycle range may be set by the circuit configuration of the duty cycle detection circuit 506, for example. In some embodiments, an acceptable duty cycle range is +/−10%. In other embodiments, an acceptable duty cycle range is +/−5%. The duty cycle detection circuit 506 may provide bias voltages BIAS and BIASF to the floating latch adjuster circuits 502 and 504, respectively, to provide further duty cycle correction or hold the duty cycle within the acceptable range. For example, the duty cycle detection circuit 506 may determine whether the duty cycle of the clock signal CLKO is within an acceptable range (e.g., 49%-51%) and adjust the voltages of the bias voltages BIAS and BIASF to change the drive strength of the inverters 510 and 516 and increase or decrease the duty cycle to bring it within the acceptable range.

Figure 6:
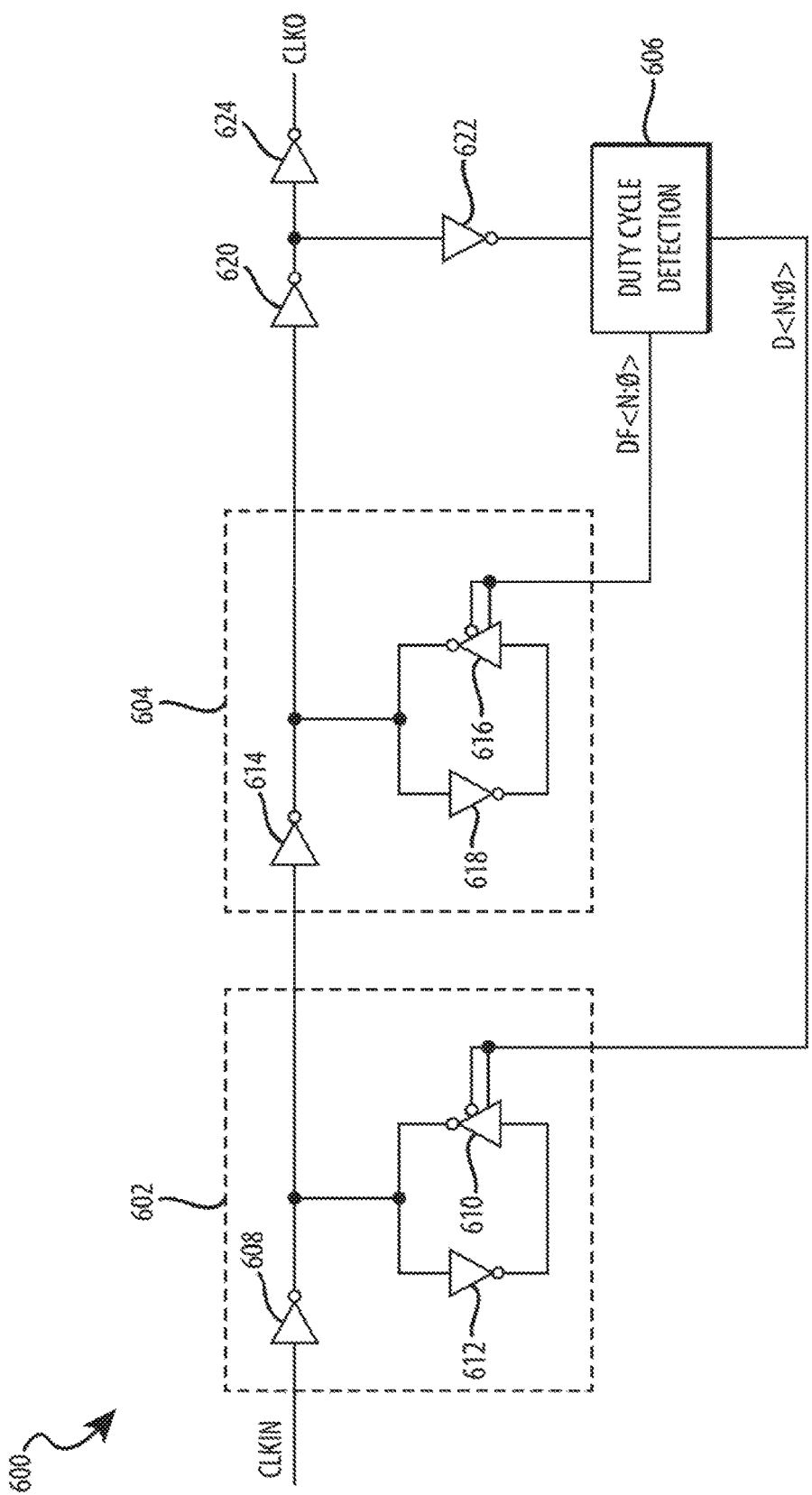
FIG. 6 is a schematic diagram of a duty cycle correction circuit with a digital floating latch adjuster circuit according to an embodiment of the present invention.

FIG. 6 is a schematic diagram of a DCC circuit, generally designated 600 with two digital floating latch adjuster circuits according to an embodiment of the present invention. DCC circuit 600 may include floating latch adjuster circuits 602 and 604, output inverters 620, 622, and 624, and duty cycle detection circuit 606. DCC circuit 600 may receive a clock signal CLKIN and provide as clock signal CLKO. The floating latch adjuster circuit 502 may be used to adjust the duty cycle of a single ended clock signal CLKIN.

Floating latch adjuster circuit 602 may include inverters 608, 610 and 612. Inverter 602 may have a drive strength that is substantially constant and receive the input clock signal CLKIN. An output node of inverter 608 may be coupled to the floating latch adjuster circuit 604 and an input node of inverter 612. An output node of inverter 612 may be coupled to the input node of the inverter 610. The out node of inverter 610 may be coupled to the output node of the inverter 608 and the input node of the inverter 612. The inverters 612 and 610 may constitute a floating latch in which the output of the inverter 612 is floating (e.g., it is not connected to any circuit elements other than the inverter 610). The inverter 610 may also receive a multibit digital signal D<N:0> configured to selectively adjust the drive strength of the inverter 610. By selectively adjusting the drive strength of the inverter 610, the slew rate of the rising and/or falling edges of the clock signal CLKIN at an output of the inverter 608 may be adjusted to modify the duty cycle of the clock signal CLKO. An example embodiment of the inverter 610 is discussed in further detail below with respect to FIG. 8.

A second floating latch adjuster circuit 604 may be used to increase the precision with which the duty cycle of the clock signal CLKIN may be adjusted. The floating latch adjuster circuit 604 may be substantially the same as floating latch adjuster circuit 602. For example, floating latch adjuster circuit 604 may include inverters 614, 616, and 618. Inverter 614 may have a substantially constant drive strength and receive the output signal of the floating latch adjuster circuit 602, which is the clock signal CLKIN with an adjusted duty cycle. Inverters 616 and 618 may be analogous to inverters 610 and 612, respectively. For example, in some embodiments, the inverters 616 and 618 may have the same circuit configuration as the inverters 610 and 612, respectively. Inverter 616 may receive a multibit digital signal DF<N:0>. In various embodiments, the digital signal DF<N:0> may be the complement of the digital signal D<N:0>. By increasing the number of floating latch adjuster circuits, the range over which the duty cycle may be adjusted may be increased.

The floating latch adjuster circuit 604 may provide its output signal to one or more output inverters, such as output inverters 620, 622, and 624. The output of the floating latch adjuster circuit 604 may be provided, via one or more of the output inverters 620, 622 and/or 624 to a duty cycle detection circuit 606. The duty cycle detection circuit 606 includes one or more circuit components configured to determine the duty cycle of the received output signal and generate digital bias information which may be provided to the inverters 610 and/or 616. The bias information may take the form of one or more multibit digital signals (e.g., digital signals D<N:0> and DF<N:0>) which may be provided to inverters 610 and/or 616 to adjust the duty cycle of the clock signal CLKIN until the duty cycle of the clock signal CLKO is within an acceptable duty cycle range.

Figure 7:
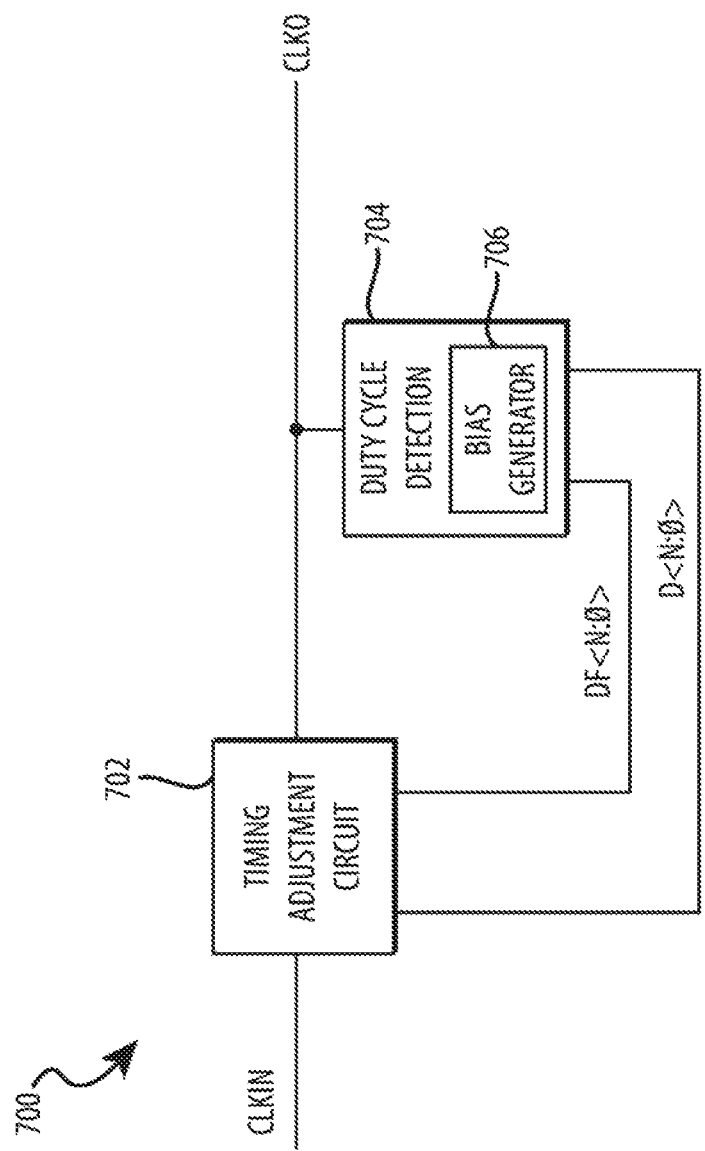
FIG. 7 is a block diagram of a duty cycle correction circuit with a floating latch adjuster circuit according to an embodiment of the present invention.

FIG. 7 is a block diagram of a DCC circuit, generally designated 700, with a floating latch adjuster circuit according to an embodiment of the present invention. DCC circuit 700 may include a timing adjustment circuit 702 and a duty cycle detection circuit 704.

Timing adjustment circuit 702 may include one or more floating latch adjuster circuits as described above with respect to FIG. 5. In the embodiment of FIG. 7, timing adjustment circuit 702 receives an clock signal CLKIN, adjusts the duty cycle of the clock signal CLKIN, and provides a clock signal CLKO having an adjusted duty cycle.

The output of timing adjustment circuit 702 may also be coupled to a duty cycle detection circuit 704. Duty cycle detection circuit 704 may be implemented as duty cycle detection circuit 506 as described above with respect to FIG. 5. Duty cycle detection circuit 704 may include one or more circuit components configured to receive the output of the timing adjustment circuit 702, determine the duty cycle of the output signal and whether it falls within an acceptable range, and generate one or more bias signals BIAS, BIASF that may be provided to the timing adjustment circuit 702. In various embodiments, the duty cycle detection circuit 704 may be implemented in accordance with the embodiments described above with respect to FIGS. 3A and 3B, in combination with a phase splitter circuit. In certain embodiments, the duty cycle detection circuit 704 includes a bias, generator circuit 706 for performing one or more of the functions of the duty cycle detection circuit. For example, the bias generator 706 may receive the output signal of the timing adjustment circuit 702 and generate one or more bias signals BIAS, BIASF based on the duty cycle of the output signal. In other embodiments, the bias generator 706 may produce one or more multibit digital signals (e.g., digital signals D<N:0>, DF<N:0>) by determining a duty cycle adjustment based on the duty cycle of the clock signal CLKO and determining one or more transistors in an adjustable inverter (e.g., inverters 610, 616) to activate or deactivate in order to adjust the adjustable inverter to achieve the desired duty cycle adjustment. In one embodiment, the bias generator generates the digital signals D<N:0>, DF<N:0> based on a determination that the duty cycle of the clock signal CLKO should be increased or decreased. The digital signals D<N:0>, DF<N:0> may increase or decrease the duty cycle of the clock signal CLKIN by a predetermined step size. In some embodiments, the bias generator may determine an amount of increase or decrease and provide the bias information based on the determined amount of increase or decrease.

In the depicted embodiment, the bias signals BIAS and BIASF are analog signals which provide a bias voltage to one or more inverters in the timing adjustment circuit 702 to adjust the drive strength of the inverters, as discussed above with respect to FIG. 5. However, those skilled in the art will appreciate that the output of the duty cycle detection circuit may be multibit digital signals as described above with respect to FIG. 6. In such embodiments, the duty cycle detection circuit 704 may receive the output of the timing adjustment circuit 702 and determine one or more multibit digital signals (e.g., digital signals DF<N:0>, DF<N:0>) which adjust the drive strength of one or more inverters (e.g., inverters 610, 616) in the timing adjustment circuit 702 to adjust the duty cycle of the clock signal CLKO.

Figure 8:
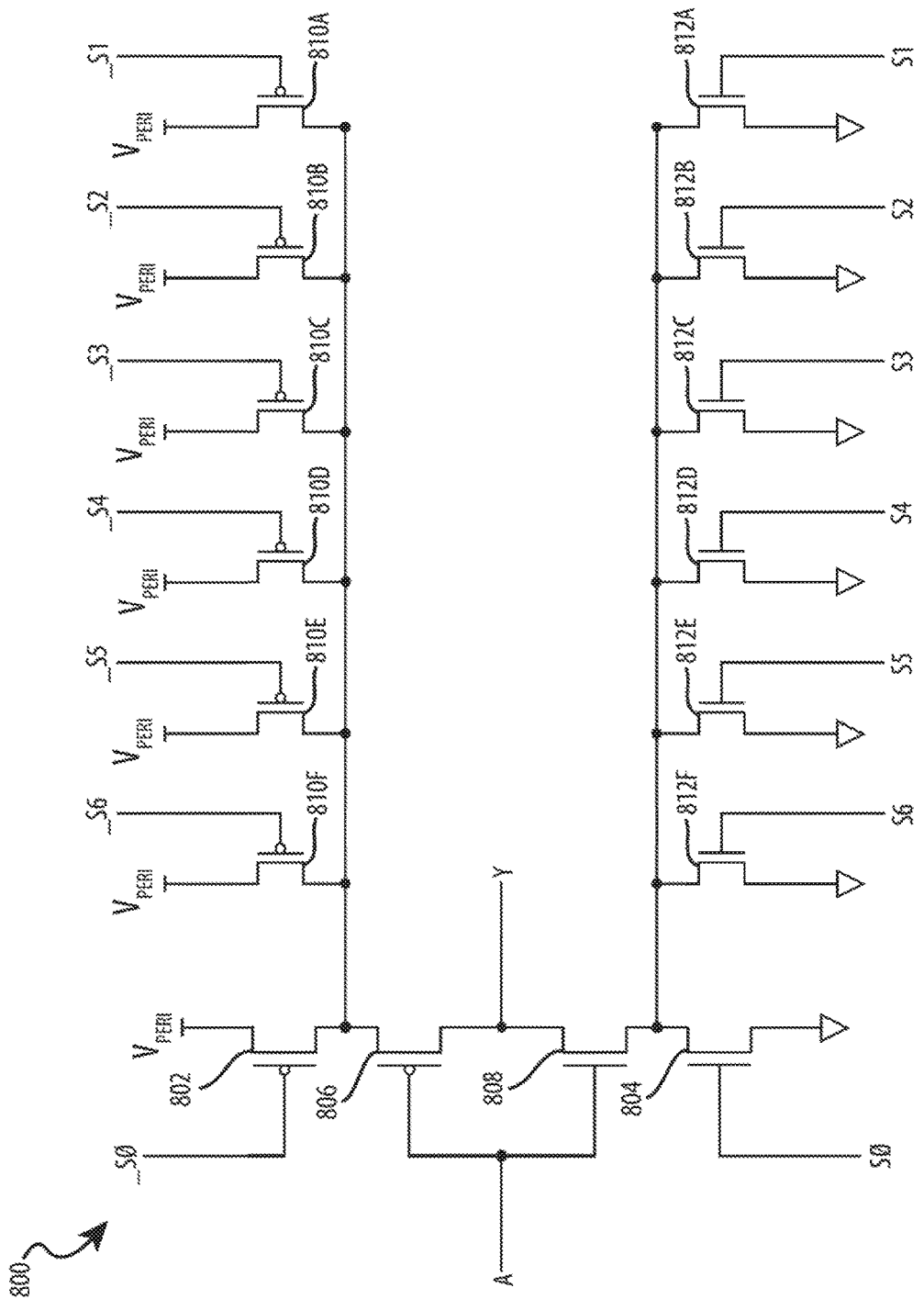
FIG. 8 is a schematic diagram of an inverter according to an embodiment of the present invention.

FIG. 8 is a schematic diagram of an adjustable inverter, generally designated 800, according to an embodiment of the present invention. The adjustable inverter 800 may be implemented as the inverters 610, 616 described above with respect to FIG. 6.

The adjustable inverter 800 may include a plurality of transistors 802, 804, 806, 808, 810A-F, and 812A-F. The transistors 802, 806, and 810A-F may be p-type transistors. The transistors 804, 808, and 812A-F may be n-type transistors. The transistors 806 and 808 may be coupled in series to form an inverter circuit. The transistors 806 and 808 may receive an input signal, A, which may be the floating output of the inverter 610 or 618 as described above with respect to FIG. 6. An output signal Y may be provided at a node between the transistors 806 and 808.

The drive strength of the inverter 800 may be adjusted by selectively activating or deactivating the transistors 810A-F and 812A-F. For example, the transistors 802 and 810A-F may be used to adjust the drive strength for providing a high logic level output signal. Adjusting the drive strength in this manner may adjust the skew of the rising edges of the output signal Y. Each of the transistors 802 and 810A-E may be arranged in parallel and coupled in series with the transistor 806. Each of the transistors 802 and 810A-F may also be coupled to a voltage source, $V_{pen}$. Each of the transistors 810A-F may represent two or more transistors of equal size. For example, transistor 810A may represent two parallel transistors of equal size coupled to the transistor 806. Similarly, the transistors 810B may represent four parallel transistors of equal size coupled the transistor 806. However, the size of the transistors 810A may be different from the size of the transistors 810B. Accordingly, each of the transistors 810A-F may have different sizes and represent a different number of parallel transistors. By varying the number and/or sizes of the transistors 810A-F, the precision by which the drive strength of the inverter 800 may be adjusted. The transistors 802 and 810A-F may be selectively activated or deactivated based on a plurality of activation input signals _S0, _S1, _S2, _S3, _S4, _S5, and _S6. The plurality of activation input signals may represent bits of a multibit digital signal. For example, the activation input signals may be implemented as the multibit digital signal DF<N:0> or DF<N:0> in FIG. 6.

The drive strength of the inverter 800 may be further adjusted by selectively activating and/or deactivating the transistors 804 and 812A-F. For example, the transistors 804 and 812A-F may be used to adjust the drive strength for providing a low logic level output signal. Adjusting the drive strength in this manner may adjust the skew of the falling edges of the output signal Y. Each of the transistors 804 and 812A-F may be coupled in parallel to one another and coupled in series to the transistor 808. The transistors 804 and 812A-F may each be coupled to ground. Each of the transistors 812A-F may represent two or more transistors of equal size. For example, transistor 812A may represent two parallel transistors of equal size coupled to the transistor 808. Similarly, the transistors 812B may represent four parallel transistors of equal size coupled the transistor 808. However, the size of the transistors 812A may be different from the size of the transistors 812B. Accordingly, each of the transistors 812A-F may have different sizes and represent a different number of parallel transistors. By varying the number and/or sizes of the transistors 812A-F, the precision by with which the drive strength of the inverter 800 may be adjusted. The transistors may be selectively activated or deactivated based on a plurality of activation input signals S0, S1, S2, S3, S4, S5, and S6. In various embodiments, the input signals S0, S1, S3, S4, S5, and S6 may be complementary to the input signals _S0, _S1, _S2, _S3, _S4, _S5, and _S6, respectively. The plurality of activation input signals may represent bits of a multibit digital signal. For example, the activation input signals may be implemented as the multibit digital signal D<N:0> or DF<N:0> in FIG. 6. Those skilled in the art will appreciate that there may be any number of transistors 810 and 812, and reference to 810A-F and 812A-F is by way of example only. For example, there may be more or fewer transistors 810 and 812 each having a corresponding input signal.

Figure 9:
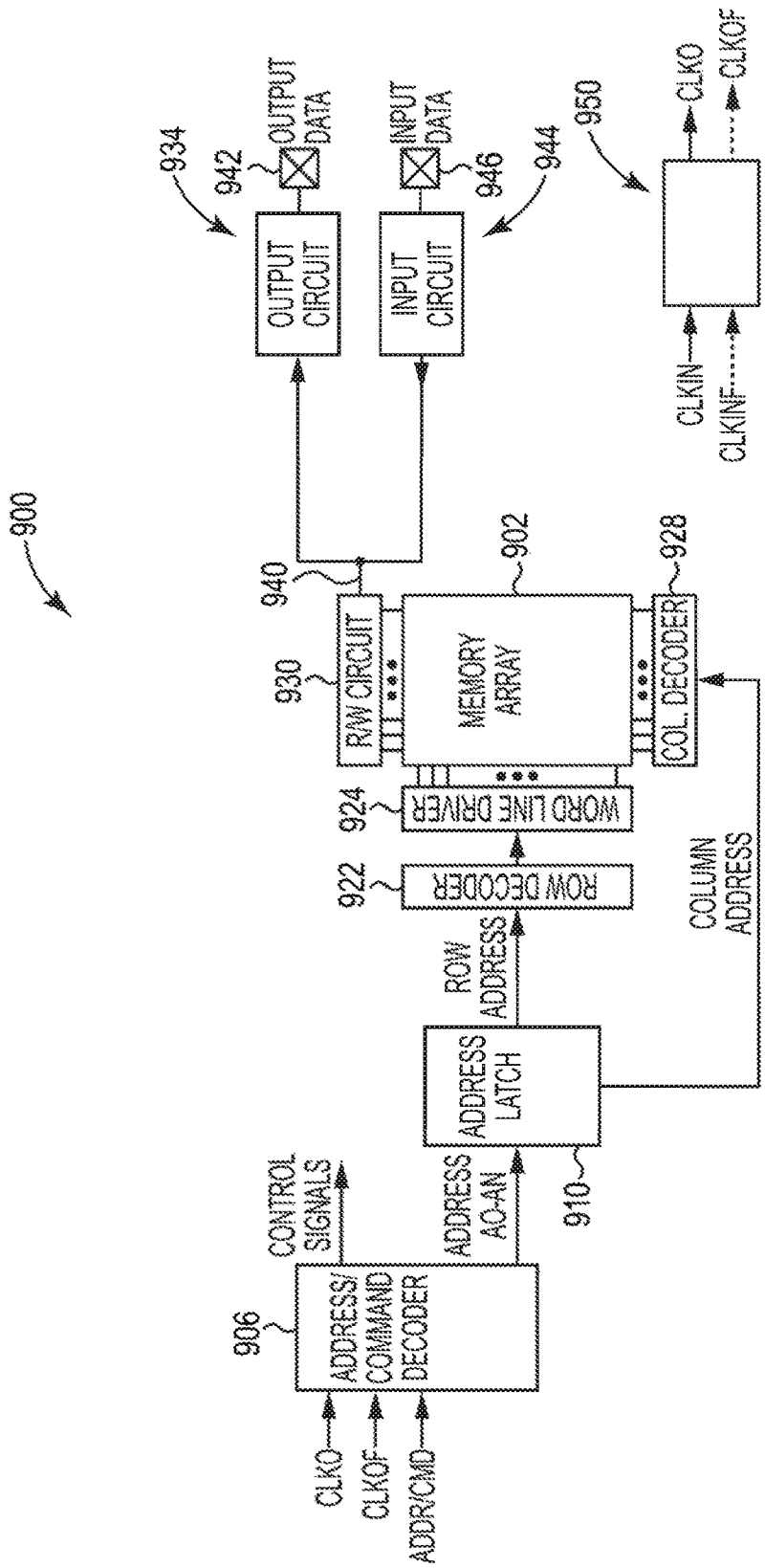
FIG. 9 is a block diagram of a memory according to an embodiment of the present invention.

FIG. 9 is as part of a memory 900 that may include at least one of the apparatus 100 of FIG. 1, the apparatus 500 of FIG. 2 and the apparatus 600 of FIG. 6 according to an embodiment of the invention. The memory 900 includes an array 902 of memory cells, which may be, for example, volatile memory cells (e.g., DRAM memory cells, SRAM memory cells), non-volatile memory cells (e.g., flash memory cells), or some other types of memory cells, and may include any number of banks and/or sections of memory as described herein. The memory 900 includes an address/command decoder 906 that receives memory commands (e.g., refresh commands) and addresses through an ADDR/CMD bus. The address/command decoder 906 generates control signals, based on the commands received through the ADDR/CMD bus. The address/command decoder 906 also provides row and column addresses to the memory 900 through an address bus and an address latch 910. The address latch then outputs separate column addresses and separate row addresses.

The row and column addresses are provided by the address latch 910 to a row address decoder 922 and a column address decoder 928, respectively. The column address decoder 928 selects lines extending through the array 902 corresponding to respective column addresses. The row address decoder 922 is connected to word line driver 924 that activates respective rows of memory cells in the array 902 corresponding to received row addresses. The selected line (e.g., a bit line or bit lines) corresponding to a received column address are coupled to a read/write circuitry 930 to provide output data 942 (e.g., read data) to a data output circuit 934 via an input-output data bus 940. Input data 946 (e.g., write data) are provided to the memory array 902 through a data input circuit 944 and the memory array read/write circuitry 930.

The memory 900 may further include a timing adjustment circuit 930 according to an embodiment of the invention. For example, the timing adjustment circuit 950 may be implemented using one of the timing adjustment circuit 100 of FIG. 1, the timing adjustment circuit 500 of FIG. 5 and the timing adjustment circuit 600 of FIG. 6 previously described. The timing adjustment circuit 950 may be configured to receive a input signal CLKIN, and provide a clock signal CLKO as described. In various embodiments implemented with differential clocks, the timing adjustment circuit 950 may also be configured to receive input signal CLKINF and provide output clock signal CLKOF as described. The output clock signals CLKO, CLKOF may be used for timing the operation of various circuits of the memory 900, such as the address/command decoder 906. Additionally or alternatively, the output clock signals CLKO, CLKOF may be used to control the output circuit 934, the input circuit 944, the address latch 910, the read/write circuitry 930, or a combination thereof.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising a clock adjusting circuit, wherein the clock adjusting circuit is configured to receive an input clock signal and provide an adjusted clock signal, and wherein the clock adjusting circuit comprises:
   an input terminal configured to receive the input clock signal;
   an output terminal configured to provide the adjusted clock signal;
   a first bias terminal configured to receive a first bias signal;
   a first inverter including a first input node and a first output node, the first input node being coupled to the input terminal, wherein the first inverter is configured to operate with a drive strength that is substantially constant; and
   a second inverter including a second input node, a second output node and a first bias node, the second input node being coupled to the first output node of the first inverter, the second output node being coupled to the first input node of the first inverter, the first bias node being couple to the first bias terminal, and the second inverter being configured to serve as a bias controlled inverter to operate with a drive strength that is based, at least in part, on the first bias signal.

2. The apparatus of claim 1, wherein the first output node of the first inverter is coupled to the output terminal.

3. The apparatus of claim 2, further comprising a duty cycle detection circuit coupled to the output terminal of the clock adjusting circuit, the duty cycle detection circuit being configured to produce the first bias signal responsive, at least in part, to the adjusted clock signal.

4. The apparatus of claim 3, wherein the clock adjusting circuit further comprises:

a complementary input terminal configured to receive a complementary input clock signal to the input clock signal;
a complementary output terminal configured to provide a complementary adjusted clock signal to the adjusted signal;
a second bias terminal configured to receive a second bias signal;
a third inverter including a third input node and a third output node, the third input node being coupled to the complementary input terminal, the third output node being coupled to the complementary output terminal, and the third inverter being configured to operate with a drive strength that is substantially constant; and
a fourth inverter including a fourth input node, a fourth output node and a second bias node, the fourth input node being coupled to the third output node of the third inverter, the fourth output node being coupled to the third input node of the third inverter, the second bias node being coupled to the second bias terminal, and the fourth inverter being configured to serve as a bias-controlled inverter to operate with a drive strength that is based, at least in part, on the second bias signal;
wherein the duty cycle detection circuit is configured to produce the first bias signal and the second bias signal responsive; at least in part, to the adjusted clock signal and the complementary adjusted signal.

5. The apparatus of claim 4, wherein the first bias signal and the second bias signal are complementary to each other.

6. The apparatus of claim 4, wherein the clock adjusting circuit further comprises:
   a fifth inverter including a fifth input node, a fifth output node and a third bias node, the third bias node being couple to the first bias terminal, and the fifth inverter being configured to serve as a bias-controlled inverter to operate with a drive strength that is based, at least in part, on the first bias signal; and
   a sixth inverter including a sixth input node, a sixth output node and a fourth bias node, the fourth bias node being couple to the second bias terminal, and the sixth inverter being configured to serve as a bias-controlled inverter to operate with a drive strength that is based, at least in part, on the second bias signal;
   wherein the fifth and sixth inverters are cross-coupled with each other between the first input terminal and the complementary input terminal.

7. The apparatus of claim 6, wherein the first bias signal is complementary to the second bias signal.

8. The apparatus of claim 6, wherein the fifth output node of the fifth inverter and the sixth input node of the sixth inverter are coupled to the input terminal, and the fifth input node of the fifth inverter and the sixth output node of the sixth inverter are coupled to the complementary input terminal.

9. The apparatus of claim 6, wherein the fifth input node of the fifth inverter and the sixth output node of the sixth inverter are coupled to the input terminal, and the fifth output node of the fifth inverter and the sixth input node of the sixth inverter are coupled to the complementary input terminal.

10. The apparatus of claim 1, wherein the adjusting circuit further comprises a third inverter inserted between the input terminal and the first input node of the first inverter, the third inverter including a third input node coupled to the input terminal and a third output node coupled to the output terminal.

11. The apparatus of claim 10, further comprising a duty cycle detection circuit coupled to the output terminal of the clock adjusting circuit, the duty cycle detection circuit being configured to produce the first bias signal responsive, at least in part, to the adjusted clock signal.

12. The apparatus of claim 10, further comprising an additional clock adjusting circuit coupled to the clock adjusting circuit, wherein the additional adjusting circuit is configured to provide a further adjusted clock signal responsive, at least in part, to the adjusted clock signal and, and wherein the additional clock adjusting circuit comprises:
- an additional input terminal configured to receive the adjusted clock signal;
- an additional output terminal configured to provide the further adjusted clock signal;
- a second bias terminal configured to receive a second bias signal;
- a fourth inverter including a fourth input node and a fourth output node, the fourth input node being coupled to the additional input terminal, and the fourth output node being coupled to the additional output terminal;
- a fifth inverter including a fifth input node and a fifth output node, the fifth input node being coupled to the fourth output node of the fourth invert; and
- a sixth inverter including a sixth input node, a sixth output node and a second bias node, the sixth input node being coupled to the fifth output node of the fifth inverter, the sixth output node being coupled to the fifth input node of the fifth inverter, the second bias node being couple to the second bias terminal, and the sixth inverter being configured to serve as a bias-controlled inverter to operate with a drive strength that is based, at least in part, on the second bias signal.

13. The apparatus of claim 12, wherein the fifth inverter is configured to operate with a drive strength that is substantially constant.

14. The apparatus of claim 13, further comprising a duty cycle detection circuit coupled to the additional output terminal of the additional clock adjusting circuit, the duty cycle detection circuit being configured to produce the first bias signal and the second bias signal responsive, at least in part, to the further adjusted clock signal.

15. The apparatus of claim 14, wherein each of the first bias signal and the second bias signal is an analog signal.

16. The apparatus of claim 14, wherein each of the first bias signal and the second bias signal is a digital signal.

17. The apparatus of claim 1, wherein the clock adjusting circuit further comprises a second bias terminal configured to receive a second bias signal, and
- wherein the first inverter further includes a second bias node, the second bias node being couple to the second bias terminal, and the first inverter being configured to serve as a bias-controlled inverter to operate with a drive strength that is based, at least in part, on the second bias signal.

18. The apparatus of claim 17, wherein the clock adjusting circuit further comprises a complementary input terminal configured to receive a complementary clock signal to the clock signal and a complementary output terminal configured to provide a complementary adjusted clock signal to the adjusted clock signal; and
- wherein the first output node of the first inverter is coupled to the complementary input terminal.

19. The apparatus of claim 18, further comprising a duty cycle detection circuit coupled to the output terminal and the complementary output terminal, the duty cycle detection circuit being configured to produce the first bias signal and the second bias signal responsive, at least in part, to the adjusted clock signal and the complementary adjusted clock signal.

* * * * *